United States Patent [19]

Fox et al.

[11] Patent Number: 4,766,383

[45] Date of Patent: Aug. 23, 1988

[54] QUADRATURE ANTENNA FOR MAGNETIC RESONANCE IMAGING USING ELLIPTICAL COILS

[75] Inventors: Timothy R. Fox, Chicago; Simon H. C. Hughes, Gurnee, both of Ill.

[73] Assignee: Kabushiki Kaisha Toshiba, Kawasaki, Japan

[21] Appl. No.: 18,035

[22] Filed: Feb. 24, 1987

[51] Int. Cl.$^4$ .................................................. G01R 33/20
[52] U.S. Cl. ..................................... 324/318; 324/322
[58] Field of Search ............... 324/300, 307, 309, 311, 324/318, 322; 128/653

[56] References Cited

U.S. PATENT DOCUMENTS 4,467,282 8/1984 Siebold ................................ 324/309
4,475,084 10/1984 Moore et al. ........................ 324/309

Primary Examiner—Stewart J. Levy
Assistant Examiner—Kevin D. O'Shea
Attorney, Agent, or Firm—Finnegan, Henderson, Farabow, Garrett & Dunner

[57] ABSTRACT

A quadrature antenna for magnetic resonance imaging systems is provided which includes first and second channels, each of these channels comprising a coil pair. Each of the four coils comprising the antenna is elliptical in shape and lies in a respective plane. The center point of each coil coincides with a reference point on the longitudinal axis of the antenna. The minor axes of the coils of the first channel coil pair are colinear. The minor axes of the coils of the second channel coil pair are also colinear with each other and are perpendicular to the minor axes of the coils of the first channel coil pair. Each of the four planes is inclined approximately forty five degrees (45°) with respect to the longitudinal axis of the antenna.

22 Claims, 7 Drawing Sheets

——— CHANNEL A
—·—·— CHANNEL B

QUADRATURE ANTENNA FOR MAGNETIC RESONANCE IMAGING USING ELLIPTICAL COILS

BACKGROUND OF THE INVENTION

1. Field of the Invention

This invention relates generally to the field of magnetic resonance imaging systems and more specifically to a quadrature antenna for a magnetic resonance imaging system using elliptical coils.

2. Description of the Related Art

Magnetic resonance imaging ("MRI"), also known as nuclear magnetic resonance ("NMR") imaging, has become a valuable tool as a safe, non-invasive means for obtaining information in the form of images of objects under examination. For example, MRI can be used as a medical diagnostic tool by providing images of the whole or selected portions of the human body without the use of X-ray photography.

MRI systems take advantage of the magnetic properties of spinning nuclei of chemical species found in the observed object in the following manner. Each of the nuclei has an internal spin axis and a magnetic pole aligned with the spin axis. The magnetic pole is a vector quantity representing the magnitude and direction of the magnetic field of the nucleus. Application of an external static magnetic field $B_o$ causes the magnetic poles to align themselves along the external magnetic field lines.

The MRI system disturbs this alignment by transmitting an electromagnetic signal to the object. The magnetic field $B_1$ of this transmitted electromagnetic signal is circularly polarized and is perpendicular to the static magnetic field $B_o$. This signal causes the nuclei to precess about the external static magnetic field lines. The frequency of this precession typically is in the radio frequency ("RF") range. More specifically, the precession frequency generally lies within a relatively narrow bandwidth of about 1 to 100 kHz at a center frequency of between 1 and 100 MHz.

As the nuclei precess, they radiate an electromagnetic signal having a circularly polarized rotating magnetic field. The frequency of this rotating magnetic field is generally equal to the precession frequency of the nuclei. The radiated signal is received by the MRI system to produce an image of the object under examination.

The circularly polarized magnetic fields of the transmitted and received RF signals described above rotate in a plane perpendicular to the static magnetic field $B_o$. For convenience, a rectilinear coordinate system is used here to describe the orientation of these magnetic fields. The static magnetic field $B_o$ is assumed to be in the direction of the Z axis. Therefore, the rotation of the circularly polarized magnetic fields is in the X-Y plane.

Quadrature coil antennas have been used in MRI systems to transmit and receive the RF signals described above. An example of such a quadrature coil antenna is shown in "Quadrature Detection Coils—A further $\sqrt{2}$ Improvement in Sensitivity," C.N. Chen, D.I. Hoult, and V.J. Sank, *J. Maqn. Reson.*, Vol. 54, 324–327 (1983). This antenna includes a cylindrical antenna structure having four saddle coils arranged into a first coil system and a second coil system. The coils of the first coil system are opposite each other. The coils of the second system are also opposite each other and are oriented 90° relative to the first coil system. Each of the coils is physically 120° wide around the lateral edge of the cylindrical antenna structure and, thus, overlaps each of its adjacent coils by 30°. With this arrangement, the first coil system responds to signals along the X axis while the second coil system responds to signals along the Y axis.

The signals received on the first and second coil systems are coherent but 90° out of phase. A transmit/receive circuit coupled to the antenna adjusts the phase difference between the signals so that they are in phase, and combines these signals to produce a single output signal. Noise in the respective coil systems is assumed to be uncorrelated. Therefore, combination of the signals results in an improved signal-to-noise ratio for the MRI system.

A drawback of this quadrature antenna design is the cross-coupling of the coil pairs. A voltage in one of the coil pairs induces a corresponding voltage in the other coil pair. This problem is attributable to the extensive overlap of each of the respective coils with its adjacent coils. It results in correlation of the noise in the respective coil systems or receiving channels of the MRI system and offsets the gain in sensitivity that is attainable with decoupled channels.

Another antenna design which has been used in MRI systems is an elliptical coil antenna. For example, a crossed ellipse coil for use in an MRI system is described in "A Crossed Ellipse RF Coil for NMR Imaging of the Head and Neck," T. W. Redpath and R. D. Selbie, *Phys. Med. Biol.*, Vol. 29, 739–744 (1984). This antenna coil comprises a single conductor wrapped around a cylindrical former for one nearly complete revolution at an inclination of approximately 45° from the longitudinal axis of the former. Each end of the conductor is then turned 90° and wrapped around the former, also at an inclination of approximately 45° with respect to the longitudinal axis of the former. This antenna has a magnetic field polarization axis directed either along or perpendicular to the longitudinal axis of the former, depending on the specific configuration of the antenna.

The performance of this antenna is limited by its inability to respond to more than one direction, i.e., along both the X and Y axes. It can respond to the X or the Y component of the circularly polarized magnetic fields, but not both simultaneously.

Accordingly, it is an object of the present invention to provide an antenna for an MRI system which has reduced cross-coupling between the respective channels or coil systems of the antenna. It is further an object of the present invention to provide an antenna for an MRI system which provides signal response of both the X and Y components (perpendicular to the direction of the static magnetic field) of the circularly polarized magnetic fields of the transmitted and received RF signals.

Additional objects and advantages of the invention will be set forth in the description which follows, and in part will be obvious from the description, or may be learned by practice of the invention. The objects and advantages of the invention may be realized and obtained by means of the instrumentalities and (combinations particularly pointed out in the appended claims.

SUMMARY OF THE INVENTION

To achieve the foregoing objects, and in accordance with the purposes of the invention as embodied and broadly described herein, a quadrature antenna for magnetic resonance imaging having a longitudinal axis is provided which comprises first and second channels. The first channel includes a first elliptical coil lying in a first plane. The center point of this first coil coincides with a reference point on the longitudinal axis of the antenna. For convenience, a reference plane is defined which intersects the longitudinal axis at the reference point and is normal to the longitudinal axis. The minor axis of the first coil lies in this reference plane. The first plane is inclined approximately 45° with respect to the longitudinal axis.

The first channel also includes a second elliptical coil lying in a second plane. The center point of the second coil also coincides with the reference point. The minor axis of the second coil lies in the reference plane and is colinear with the minor axis of the first coil. The second plane is normal to the first plane and inclined approximately 45° with respect to the longitudinal axis.

The first channel also includes means for electrically coupling the first channel to an external transmit/receive circuit.

The second channel includes a third elliptical coil lying in a third plane. The center point of this coil also coincides with the reference point. The minor axis of the third coil lies in the reference plane and is perpendicular to the minor axis of the first coil. The third plane is also inclined approximately 45° with respect to the longitudinal axis.

The second channel also includes a fourth elliptical coil lying in a fourth plane. The center point of the fourth coil coincides with the reference point. The minor axis of the fourth coil also lies in the reference plane and is colinear with the minor axis of the third coil. The fourth plane is normal to the third plane and is inclined approximately 45° with respect to the longitudinal axis.

The second channel also includes means for electrically coupling the second channel to an external transmit/receive circuit.

The antenna also preferably includes shielding means for shielding the first channel from the second channel.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

DESCRIPTION OF THE PREFERRED EMBODIMENT

Figure 1A:
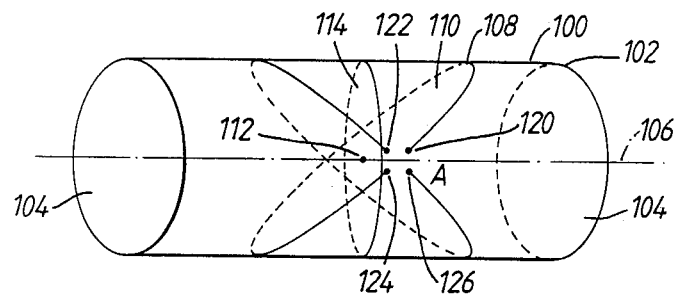
FIG. 1A is a perspective view of the first channel of the quadrature coil antenna of the preferred embodiment according to the invention.

Reference will now be made in detail to the presently preferred embodiment of the invention as illustrated in the accompanying drawings, wherein like reference characters designate like or corresponding parts throughout the several drawings.

Figure 1B:
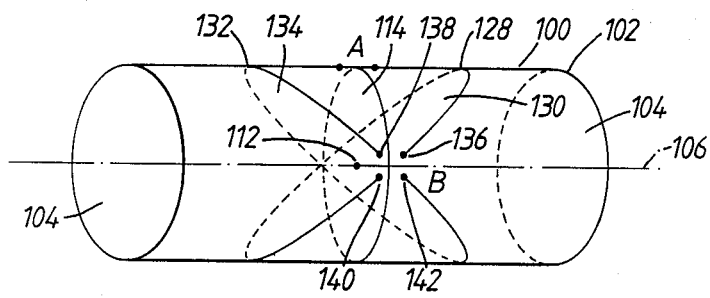
FIG. 1B is a perspective view of the second channel of the quadrature coil antenna of the preferred embodiment according to the invention.

The quadrature antenna of the preferred embodiment as illustrated in FIG. 1 comprises a first channel A (shown individually in FIG. 1A) and a second channel B (shown individually in FIG. 1B), each of which in turn comprises a pair of elliptical coils. Preferably, each of the four coils is wound onto a cylindrical former 100 made of a suitable nonconducting material, such as polyethylene. Former 100 includes a cylinder wall 102, end faces 104, and a longitudinal axis 106. The windings of each of the coils are incorporated into or on the interior or exterior surface of cylinder wall 102 of former 100. Preferably, at least one of end faces 104 is opened or openable for insertion and removal of an object to be examined such as the body of a patient. In the preferred embodiment, longitudinal axis 106 is the longitudinal axis of the antenna.

Note that while former 100 of the preferred embodiment comprises a cylinder, other geometric shapes are possible. For example, former 100 may comprise an elliptic cylinder.

The four coils of the quadrature antenna have a number of common features. Preferably, each coil is formed on former 100 by winding a suitable elongated conductor, such as wire, on cylinder wall 102. The number of turns in each of the coils is a design choice. There may be only one turn. However, if a given coil has more than one turn, the turns are positioned so that they are approximately equally spaced about cylinder wall 102 of former 100. Preferably, the dimensions of each of the four coils is substantially equal to the dimensions of each of the other coils.

Each turn of a given coil lies substantially on a two-dimensional plane. Where only a single turn is used, this turn or winding defines the plane. Where a plurality of turns are used, a central one of the turns, preferably the center turn of the coil, defines the plane.

The plane of each of the coils is inclined approximately 45° with respect to longitudinal axis 106 of former 100, and the dimensions of each of the coils conforms to cylinder wall 102 of former 100. Thus, each of the coils forms an ellipse which represents a planar geometric conic section of cylindrical former 100. As is conventional, the short axis of the ellipse is referred to as the minor axis and the long axis is referred to as the major axis. The intersection of the minor and major axes or, equivalently, the midpoint between the foci along the major axis, is the center point of the ellipse through which a coil axis extends perpendicular to the plane of the coil. The center points of the four coils are coincident at a point at or near the center of the antenna, where the object is located for examination.

As shown individually in FIG. 1A, the quadrature antenna includes a first channel A. This first channel includes a first elliptical coil 108 lying in a first plane 110. The center point of first coil 108 coincides with a reference point 112 on longitudinal axis 106 of former 100.

A reference plane 114 intersects longitudinal axis 106 at reference point 112 and is normal to longitudinal axis 106. This reference plane is not a structural element of the preferred embodiment but is used for convenience to visualize and understand the three-dimensional configuration of the structural elements of the preferred embodiment. The minor axis of first coil 108 lies in reference plane 114. As noted, first plane 110 is inclined approximately 45° with respect to longitudinal axis 106.

The first channel also includes a second elliptical coil 116 lying in a second plane 118. The center point of second coil 116 also coincides with reference point 112 on longitudinal axis 106 of former 100. The minor axis of second coil 116 is colinear with the minor axis of first coil 108 and, therefore, also lies in reference plane 114. Second plane 118 is normal to first plane 110 and is inclined approximately 45° with respect to longitudinal axis 106.

The first channel also includes means for electrically coupling the first channel to an external transmit/receive circuit. The first channel coupling means of the preferred embodiment, illustrated in FIGS. 1A and 1C includes four point connectors 120, 122, 124 and 126 located on the external surface of cylinder wall 102 at one end of the minor axes of first 108 and second 116 coils for ohmically coupling the first channel to the external transmit/receive circuitry. Each of the two ends of first coil 108 is connected to an opposing one of the four point connectors, for example, connectors 120 and 124. Each end of second coil 116 is coupled to the first channel coupling means, preferably to one of the two remaining point connectors which also oppose one another, for example, connectors 122 and 126.

The quadrature antenna of the preferred embodiment also includes a second channel B, as shown individually in FIG. 1B. The second channel includes a third elliptical coil 128 which lies in a third plane 130. The center point of third coil 128 coincides with reference point 112 on longitudinal axis 106 of former 100. The minor axis of third coil 128 also lies in reference plane 114. Third plane 130 is also inclined approximately 45° with respect to longitudinal axis 106.

The second channel B also includes a fourth elliptical coil 132 lying in a fourth plane 134, the center point of which also coincides with reference point 112. The minor axis of fourth coil 132 also lies in reference plane 114 and is colinear with the minor axis of third coil 128. The fourth plane 134 is normal to third plane 130 and, as with the other planes, is inclined approximately 45° with respect to longitudinal axis 106.

Figure 1C:
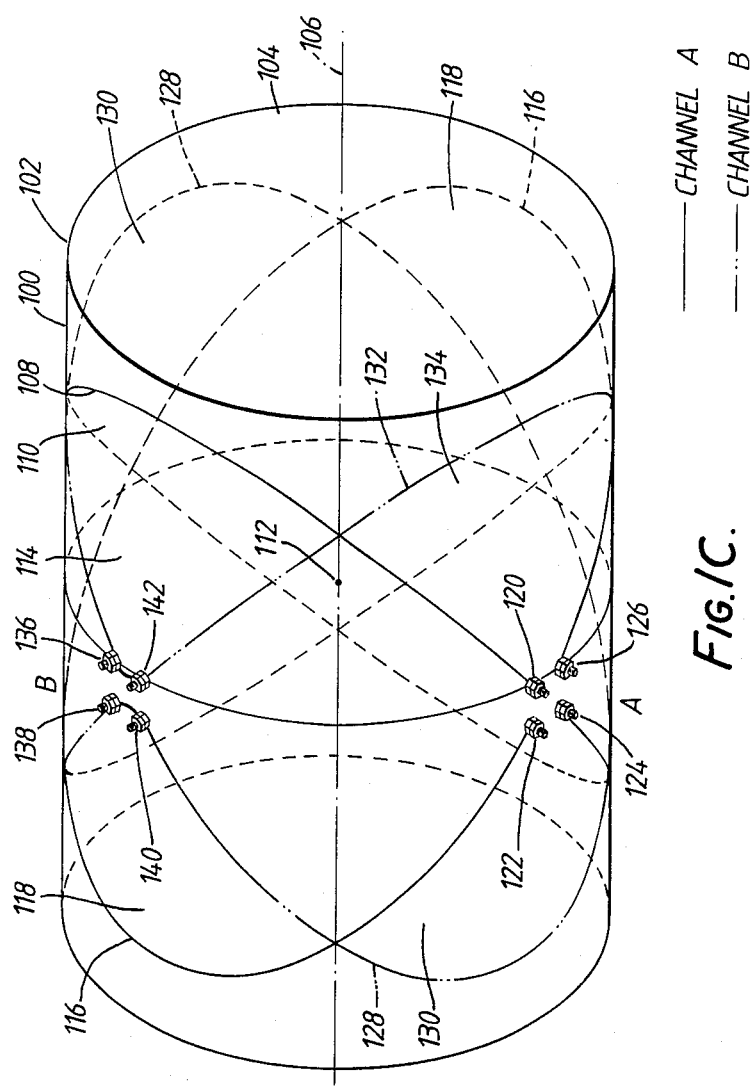
FIG. 1C is a perspective view of the quadrature coil antenna of the preferred embodiment obtained by combining the first channel shown in FIG. 1A with the second channel shown in FIG. 1B.

The second channel B includes means for electrically coupling the second channel to an external transmit/receive circuit, similar to the first channel coupling means. The second channel coupling means, as illustrated in FIGS. 1B and 1C, also preferably includes four point connectors 136, 138, 140 and 142 located on the external surface of cylinder wall 102 of former 100 at one end of the minor axes of third coil 128 and fourth coil 132 for ohmically connecting the respective ends of coil 128 and coil 132 to the external circuitry. Each of the ends of third coil 128 is coupled to an opposing one of the point connectors, for example, connectors 136 and 140. Similarly, each of the ends of fourth coil 132 is connected to the other point connector, in the example, connectors 138 and 142.

The quadrature antenna of the preferred embodiment comprises the combination of the first and second channels into a single former 100, as illustrated in FIG. 1C. The respective coils of the first and second channels are positioned into or onto former 100 so that their resultant magnetic field polarization vectors are orthogonal (perpendicular) to one another and each is orthogonal to the static magnetic field vector $B_o$, as described in detail below. Based On the description above, the minor axis of each of the four coils lies in reference plane 114 and the center point of each of the coils is coincident at reference point 112. The minor axes of first coil 108 and second coil 116, which are colinear, are substantially perpendicular to the minor axes of third coil 128 and fourth coil 132, which are also colinear. Each of the coils lies at a 45° angle with respect to longitudinal axis 106. The first channel coupling means is preferably approximately 90° (measuring around cylindrical wall 102 of former 100) from the second channel coupling means. It is to be recognized that this is not a limitation in that the objects of the invention may be met by locating the first and second channel coupling means at other positions or feed points.

It is well known that a current in a coil produces a magnetic field inside the coil having an essentially linear magnetic field polarization vector parallel to the coil axis. The magnitude of the magnetic field polarization vector depends on the number and size of turns in the coil and the magnitude of the current. The direction of the field along the coil axis is determined by the direction of the current. It is also known that the magnetic fields produced by a plurality of coils superpose and result in a net magnetic field polarization vector. The fields generated by the respective coils may interfere constructively or destructively. Conversely, a changing magnetic field within a coil induces a current in the coil, the magnitude of which depends on the strength and orientation of the magnetic field and the construction of the coil. The direction of the current depends on the orientation of the field relative to the coil.

Figure 2:
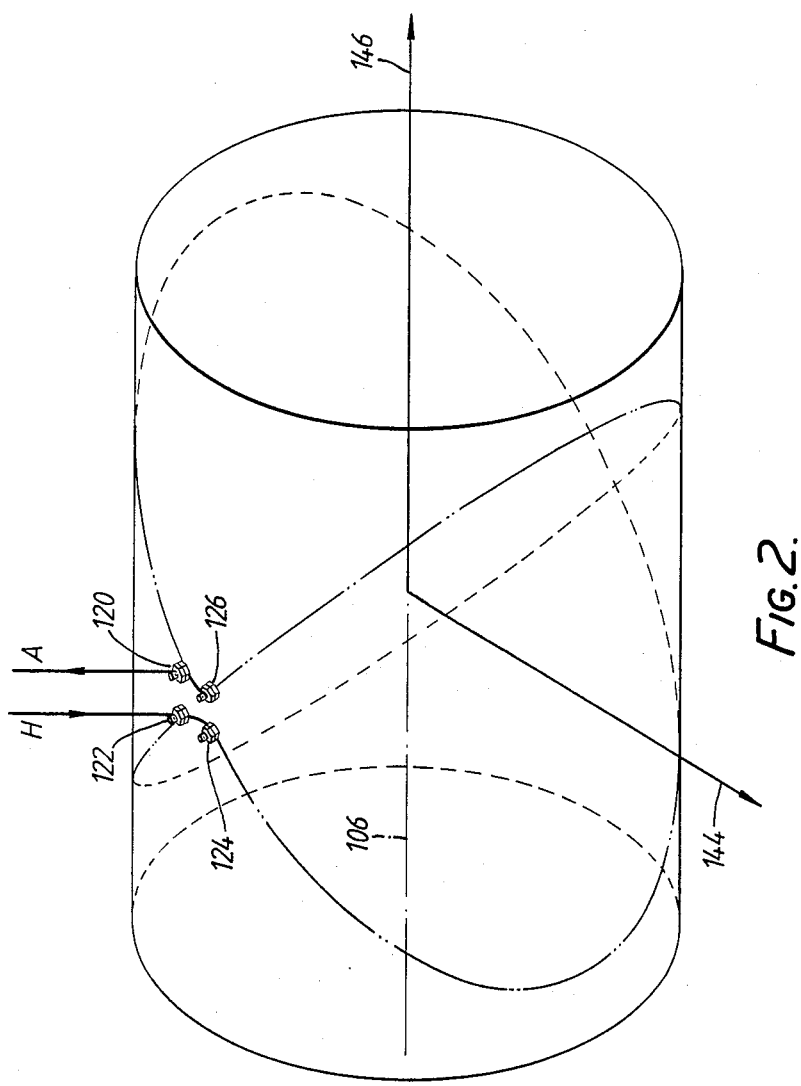
FIG. 2 shows one channel of the quadrature coil antenna of the preferred embodiment of FIG. 1C with radial and longitudinal magnetic field polarization vectors.

Each of the coil pairs of the present invention operates in accordance with these principles. The coils of both coil pairs enclose a cylindrical volume, e.g. that of cylindrical former 100 in the preferred embodiment of FIG. 1C, inside which a magnetic field may be transmitted from and received by the object under examination. The magnetic field polarization vector of each of the four coils is parallel to the coil axis of that coil and, thus, is inclined 45° with respect to longitudinal axis 106 of former 100. The coil pair of each channel comprises two coils having central axes which are perpendicular to one another. As shown in FIG. 2, the linear magnetic field polarization vectors produced by simultaneously energizing these coils combine to produce a net magnetic field polarization vector which is either perpendicular 144 or parallel 146 to longitudinal axis 106 of former 100, depending on the direction of the current in each coil. In the present invention, the magnetic field polarization vector of each of the channels is selected to be perpendicular to the static magnetic field vector $B_o$, here along the Z axis, since the static field determines the alignment of the nuclear poles of the nuclei and, thus, the two-dimensional X-Y plane in which precession occurs.

Obtaining the desired direction of the resultant magnetic field polarization vector for a given coil pair, i.e. a given channel, is accomplished by appropriately configuring the coupling means of that channel to couple the respective coils to the external transmit/receive circuit. Four alternative connection configurations may be used for each channel for the four point connector design described above. These four configurations are shown in FIG. 3 for the first channel. These configurations are equally applicable to the corresponding coupling means of the second channel.

Figure 3A:
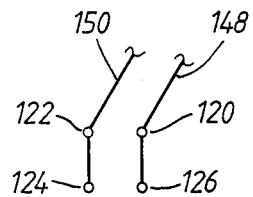
FIG. 3A shows a portion of the quadrature coil antenna of the preferred embodiment of FIG. 1C illustrating the connections made in parallel to produce a radial magnetic field vector.

A first configuration in which first coil 108 and second coil 116 of the first channel are connected in parallel to produce a desired radial magnetic field polarization vector 144 (perpendicular to longitudinal axis 106 of former 100 as shown in FIG. 2) is shown in FIG. 3A. Point connectors 120 and 126 are electrically coupled as are point connectors 122 and 124. A first lead 148 of the transmit/receive circuit is electrically coupled to point connectors 120 and 126. The point of coupling first transmit/receive circuit lead 148 to the coupling means of one of the antenna channels is referred to here as a first transmit/receive terminal. A second lead 150 of the transmit/receive circuit is electrically coupled to point connectors 122 and 124. The point of coupling second transmit/receive circuit lead 150 to the coupling means of one of the antenna channels is referred to here as a second transmit/receive terminal. First coil 108 and second coil 116 are thus coupled in parallel with respect to transmit/receive circuit leads 148 and 150. A sinusoidal voltage applied across transmit/receive leads 148 and 150 will produce a magnetic field perpendicular to longitudinal axis 106 as desired (assuming the construction of the first 108 and second 116 coils are essentially identical).

Figure 3B:
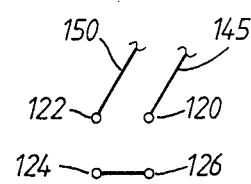
FIG. 3B shows a portion of the quadrature coil antenna of the preferred embodiment of FIG.1C illustrating the connections made in series to produce a radial magnetic field vector.

A second configuration in which the first coil 108 and second coil 116 of the first channel are connected in series to produce a desired radial magnetic field polarization vector (perpendicular to longitudinal axis 106 of former 100 as shown in FIG. 2) is shown in FIG. 3B. Point connectors 124 and 126 are electrically coupled. First lead 148 of the transmit/receive circuit is electrically coupled to point connector 120 at the first transmit/receive terminal. Second lead 150 of the transmit/receive circuit is electrically coupled to point connector 122 at the second transmit/receive terminal. First coil 108 and second coil 116 are thus coupled in series with respect to transmit/receive circuit leads 148 and 150. A sinusoidal voltage applied across transmit/receive leads 148 and 150 will produce a magnetic field perpendicular to longitudinal axis 106 as desired (assuming the construction of first 108 and second 116 coils are essentially identical).

Figure 3C:
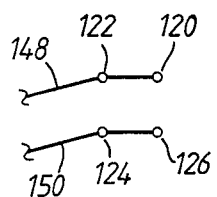
FIG. 3C shows a portion of the quadrature coil antenna of the preferred embodiment of FIG. 1C illustrating the connections made in parallel to produce an axial magnetic field vector.

Similarly, a third configuration, illustrated in FIG. 3C, couples first coil 108 and second coil 116 of the first channel in parallel to produce a desired axial magnetic field polarization vector (parallel to longitudinal axis 106 of former 100 as shown in FIG. 2). Point connectors 120 and 122 are electrically coupled as are point connectors 124 and 126. First lead 148 of the transmit/receive circuit is electrically coupled to point connectors 120 and 124 at the first transmit/receive terminal. Second lead 150 of the transmit/receive circuit is electrically coupled to point connectors 122 and 126 at the second transmit/receive terminal. First coil 108 and second coil 116 are thus coupled in parallel with respect to transmit/receive circuit leads 148 and 150. Again assuming that the construction of coils 108 and 116 are essentially identical, a sinusoidal voltage applied across transmit/receive leads 148 and 150 will produce a magnetic field parallel to longitudinal axis 106 of former 100.

Figure 3D:
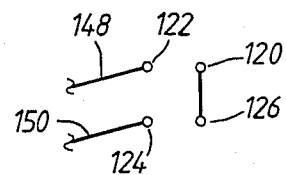
FIG. 3D shows a portion of the quadrature coil antenna of the preferred embodiment of FIG. 1C illustrating the connections made in series to produce an axial magnetic field vector.

A fourth configuration in which first 108 and second 116 coils of the first channel are connected in series to produce a desired axial magnetic field polarization vector (parallel to longitudinal axis 106 of former 100 as shown in FIG. 2) is shown in FIG. 3D. Point connectors 120 and 126 are electrically coupled. First lead 148 of the transmit/receive circuit is electrically coupled to point connector 122 at the first transmit/receive terminal. Second lead 150 of the transmit/receive circuit is electrically coupled to point connector 124 at the second transmit/receive terminal. First coil 108 and second coil 116 are thus coupled in series with respect to transmit/receive circuit leads 148 and 150. A sinusoidal voltage applied across transmit/receive leads 148 and 150, retaining the assumption of essentially identical construction of coils 108 and 116, will produce a magnetic field parallel to longitudinal axis 106.

It will be apparent that connections at the first and second transmit/receive terminals may be reversed since a sinusoidal voltage is used.

As noted, these configurations are equally applicable to the corresponding point connectors of the second channel coupling means. Each connector configuration for the second channel involves a first and a second transmit/receive terminal coupled to a third and a fourth transmit/receive circuit lead, 152 and 154, respectively (FIGS. 5 and 6).

By orienting the minor axes of the coils of the first channel A at a 90° angle with respect to the minor axes of the coils of the second channel B, the respective coupling means may be configured to obtain magnetic field polarization vectors of the respective first and second channels which are perpendicular to one another and to the static magnetic field $B_o$. For example, use of the first connection configuration described above for both channels results in orthogonal radial magnetic field polarization vectors. These orthogonal magnetic field vectors may be used to transmit and receive the X and Y components of the angular or rotational magnetic fields while the static magnetic field $B_o$ is in the Z direction parallel to longitudinal axis 106 of former 100.

An advantage of the present invention over conventional quadrature coil antenna designs is attributable to the minimal physical overlap of the coils. The coils of a given channel in the preferred embodiment overlap one another at a single point directly opposite the coupling means at the end of the minor axes of the coils for coils having a single turn, and at only one additional point at the other end of the minor axes of the coils for coils having more than one turn. The coils of the first channel overlap the coils of the second channel at eight points, four points on each side of reference plane 114.

Cross-talk between the coils of a given channel does not adversely affect performance of the MRI system since the two coils of that channel are electrically coupled at the coupling means and the same signal is simultaneously transmitted or received in both coils. However, as described above with reference to conventional quadrature antenna designs, cross-talk between the first and second channels does degrade performance of the system since the assumption that noise in the system is uncorrelated is no longer valid. Accordingly, the quadrature antenna of the preferred embodiment includes shielding means for shielding the first channel from the second channel.

Figure 4A:
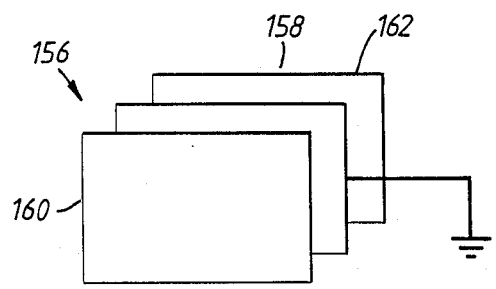
FIGS. 4A and 4B illustrate an example of shielding means for electrostatically shielding the first and second channels of the quadrature coil antenna of the preferred embodiment shown in FIG. 1C.

The shielding means may include electromagnetic and electrostatic shielding. The shielding means of the preferred embodiment include electrostatic shielding means which limits or prevents a voltage in the coil pair of one channel from being imparted to the coil pair of the other channel, thus electrically isolating or decoupling the first channel from the second channel. The shielding means of the preferred embodiment as illustrated in FIG. 4A comprises a plurality of shielding plates 156 each including a grounded conductive sheet 158, such as a metallic foil or plate, which serves as an electromagnetic shield sandwiched between first and second dielectric layers 160 and 162, respectively. Dielectric layers 160 and 162 prevent electrical conduction from the first channel A to the second channel B through conductive sheets 158. Dielectric layers 160 and 162 may be of the same or different composition. Preferred materials for the dielectric layers include polyethylene, polypropylene, and polystyrene. Also preferred are polyfluoro hydrocarbons such as polytetrafluoroethylene.

Figure 4B:
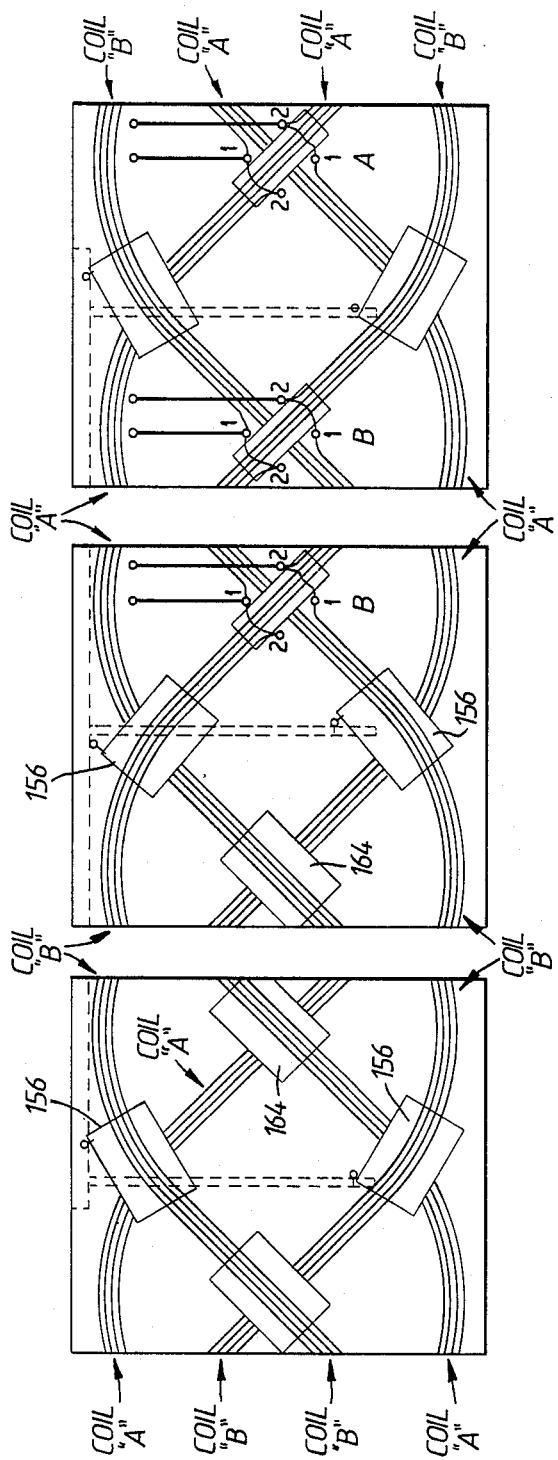

As shown in FIG. 4B, the shielding means of the preferred embodiment comprises a plurality of these sandwiched shielding plates 156, each being a flat patch having a width approximately three times the width of the one of the respective coils which it shields having the greatest width. The flat surface of each of shielding plates 156 conforms to the coils and cylinder wall 106 of former 100. An insulator 164 similar in size and shape to shielding plates 156 is also preferably positioned at the coupling means and crossing points of each of the respective coils of a given channel to prevent shorting of the coils at these point, as shown in FIG. 4B.

The first and second channels are 90° out of phase with respect to one another based on their physical location, as described above. For example, a magnetic field rotating inside former 100 with uniform angular velocity as produced by the precessing nuclei N and will produce a sinusoidal signal on the first channel A that is coherent with and 90° out of phase with the signal on the second channel B. Conversely, a signal on one channel that is coherent with and 90° out of phase with a signal on the other channel can provide the rotating magnetic field $B_1$ which can impart a corresponding rotational magnetic force on the object within former 100. The transmit/receive circuit coupled to the quadrature coil antenna of the present invention is designed to take advantage of this phase angle relationship.

The quadrature antenna of the present invention can be used to transmit and receive RF signals. Each of the channels of the quadrature antenna of the present invention may be coupled to a transmit/receive circuit which provides a pulsed RF signal to the antenna and receives a response signal from the antenna, as described above. There is flexibility in the configuration of the transmit/receive circuit relative to the antenna. For example, both channels may be coupled to a single transmit/receive circuit, or each channel may be coupled to a separate transmit/receive circuit. Furthermore, the transmit/receive circuit may comprise a separate transmitter and a separate receiver. To illustrate the coupling of the quadrature antenna of the present invention to a transmit/receive circuit, and to illustrate the operation of the antenna in conjunction with the transmit/receive circuit, the transmit/receive circuit will be assumed to include a separate transmitter and a separate receiver. Two embodiments of a quadrature transmitter and two embodiments of a quadrature receiver will be described. It is emphasized that the transmit/receive circuits discussed here are by way of example and not limitation.

Figure 5A:
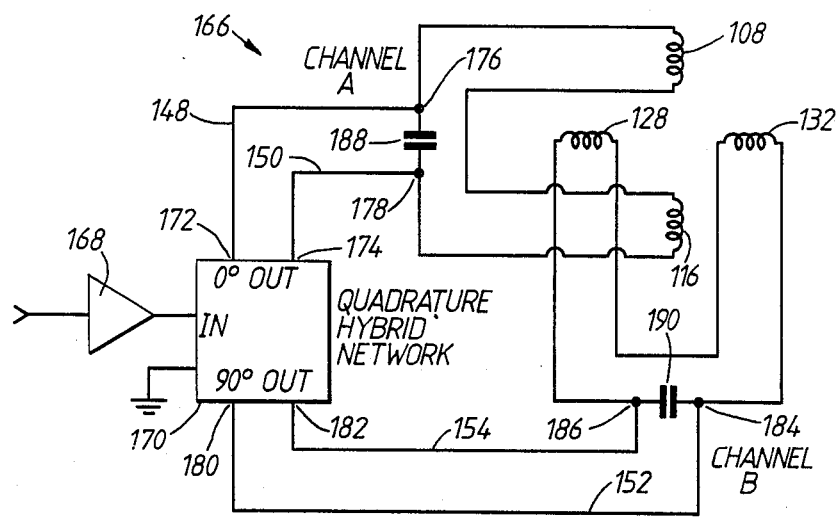
FIGS. 5A and 5B show two embodiments of a quadrature transmitter circuit for driving the quadrature coil antenna of the preferred embodiment.

The first quadrature transmitter configuration 166, shown in FIG. 5A, comprises an amplifier 168 coupled to a phase shifter 170, the latter of which preferably comprises a quadrature hybrid network. Phase shifter 170 includes a signal splitter and first and second channels. The first channel has a first and a second output port 172 and 174, respectively. First output port 172 is electrically coupled to the first transmit/receive terminal 176 of the first channel A of the antenna by first transmit/receive circuit lead 148. Second output port 174 is electrically coupled to the second transmit/receive terminal 178 of the first antenna channel A by second transmit/receive circuit lead 150. The second channel of phase shifter 170 also has a first and a second output port 180 and 182, respectively. First output port 180 is electrically coupled to the first transmit/receive terminal 184 of the second channel B of the antenna by third transmit/receive circuit lead 152. Second output port 182 is electrically coupled to the second transmit/receive terminal 186 by fourth transmit/receive circuit lead 154. Tuning capacitors 188 and 190 are placed between the first and second transmit/receive terminals of the respective channels of the antenna.

The operation of the quadrature transmitter configuration of FIG. 5A is as follows. An RF signal is provided at the input terminals of amplifier 168 where the signal is amplified and transmitted to phase shifter 170. The signal splitter splits the signal into two identical signals—a first channel signal and a second channel signal. The first channel signal is transmitted to first output port 172 and second output port 174 of the first channel of phase shifter 170. The first channel signal is then transmitted to the first channel A of the antenna by first and second transmit/receive circuit leads 148 and 150. The phase of the second channel signal is shifted by 90° with respect to the phase of the first channel signal by phase shifter 170. This phase shifted second channel signal is then provided at first output port 180 and second output port 182 of phase shifter 170 from which it is transmitted to the second channel B of the antenna by transmit/receive circuit leads 152 and 154, while retaining its phase relationship with respect to the first channel signal. Thus, this quadrature transmitter converts a single RF signal into two coherent signals having a 90° phase difference. These signals are provided to the respective channels of the antenna of the present invention which transmits these signals along two separate perpendicular axes (X and Y) to provide the circularly polarized magnetic field $B_1$ which causes precession.

Figure 5B:
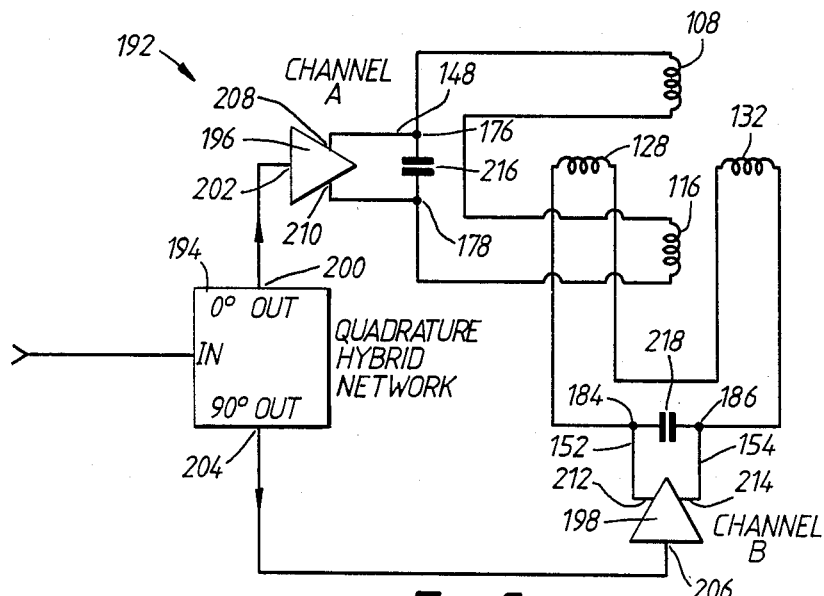

A second quadrature transmitter configuration 192 is shown in FIG. 5B. This configuration differs from the configuration 166 shown in FIG. 5A in that a separate amplifier is used for each channel. The quadrature transmitter configuration 192 shown in FIG. 5B comprises a phase shifter 194, such as a quadrature hybrid circuit, coupled to a first channel amplifier 196 and a second channel amplifier 198. Phase shifter 194 comprises a signal splitter and a first and a second channel. Each of the first and second channels has an output port. The output port 200 of the first channel is coupled to the input terminal 202 of first channel amplifier 196. The output port 204 of the second channel is coupled to the input terminal 206 of second channel amplifier 198. First channel amplifier 196 has a first output terminal 208 coupled to first transmit/receive terminal 176 of the first channel A of the antenna by first transmit/receive circuit lead 148. A second output terminal 210 of first channel amplifier 196 is coupled to second transmit/receive terminal 178 of the first channel A of the antenna by second transmit/receive circuit lead 150. Similarly, second channel amplifier 198 has a first output terminal 212 coupled to first transmit/receive terminal 184 of the second channel B of the antenna by third transmit/receive circuit lead 152, and a second output terminal 214 coupled to the second transmit/receive terminal 186 of the second channel B of the antenna by fourth transmit/receive circuit lead 154. Tuning capacitors 216 and 218 are placed between the first and second transmit/receive terminals of the respective channels of the antenna.

The operation of the quadrature transmitter configuration 192 of FIG. 5B is as follows. A single RF signal is provided at the input to phase shifter 194. The signal splitter splits the signal into two coherent signals, again a first and a second channel signal. The first channel signal is transmitted to output port 200 of the first channel of phase shifter 194 and to the input terminal 202 of the first channel amplifier 196. First channel amplifier 196 amplifies this first channel signal and applies it across its output terminals 208 and 210, thus providing the amplified first channel signal to transmit/receive terminals 176 and 178 of the first channel A of the antenna by transmit/receive circuit leads 148 and 150, respectively. The phase of the second channel signal is shifted by 90° with respect to the phase of the first channel signal by phase shifter 194. This phase shifted second channel signal is then provided to output port 204 of the second channel of phase shifter 194 from which it is transmitted to the input terminal 206 of second channel amplifier 198. Second channel amplifier 198 amplifies this phase shifted second channel signal and applies it across its output terminals 212 and 214 while retaining the phase relationship of the first and second channel signals. In this manner, the second channel signal is provided to transmit/receive terminals 184 and 186 of the second channel B of the antenna by transmit/receive circuit leads 152 and 154, respectively. Configuration 192 results in essentially the same result as transmitter configuration 166.

Figure 6A:
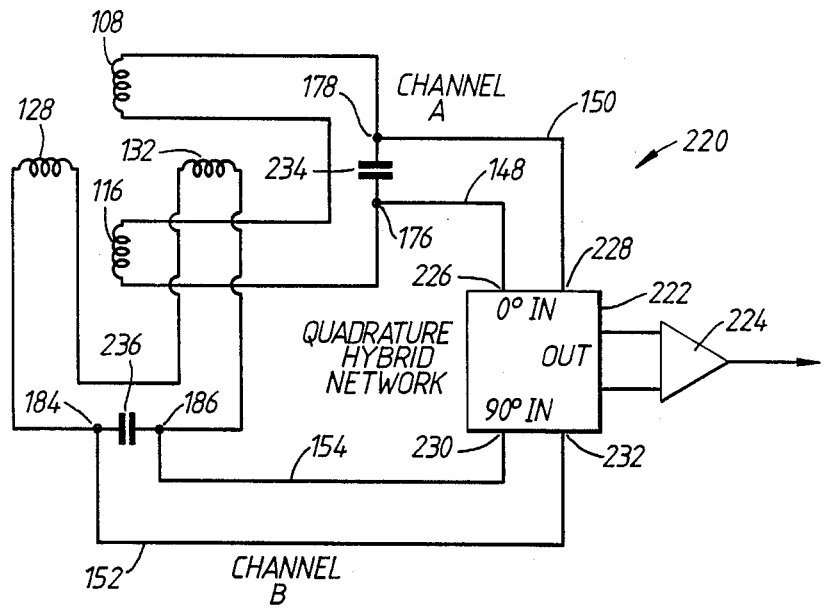
FIGS. 6A and 6B show two embodiments of a quadrature receiving circuit for receiving signals from the quadrature coil antenna of the preferred embodiment.

Two quadrature receiver configurations are shown in FIG. 6. The first quadrature receiver configuration 220, shown in FIG. 6A, is analogous to quadrature transmitter configuration 166 of FIG. 5A. It includes phase shifter 222 coupled to output amplifier 224. Phase shifter 222, which may be a quadrature hybrid network, includes a quadrature combiner and a first and second channel. Each of the first and second channels has two input ports. Phase shifter 222 includes input ports 226 and 228 of the first channel coupled to transmit/receive terminals 176 and 178 of the first channel A of the antenna by transmit/receive circuit leads 148 and 150, respectively. Phase shifter 222 also includes input ports 230 and 232 of the second channel coupled to transmit/receive terminals 184 and 186 of the second channel B of the antenna by transmit/receive circuit leads 152 and 154, respectively. The output of phase shifter 222 is coupled to output amplifier 224. Tuning capacitors 234 and 236 are placed between the first and second transmit/receive terminals of the respective channels of the antenna.

A rotating RF signal generated by the precessing nuclei N of an object within the antenna is applied at transmit/receive terminals 176 and 178 of the first channel A to create a first channel signal. Ninety degrees (90°) later as the magnetization rotates, this signal is applied at first and second transmit/receive terminals 184 and 186 of the second antenna channel B to create a second channel signal 90° out of phase with respect to the first channel signal. The first channel signal is transmitted to input ports 226 and 228 of the first channel of phase shifter 222 and the second channel signal is transmitted to input ports 230 and 232 of the second channel of phase shifter 232. The phase of the second channel signal is shifted by 90° by phase shifter 222 so that it is in phase with the first channel signal. The first channel signal is then combined with the phase shifted second channel signal by the quadrature combiner. The combined signal is transmitted to output amplifier 224. Thus, the antenna receives both components (X and Y) of the RF signal generated by the precessing nuclei N. Although the signal is received on two separate channels A and B of the antenna, the quadrature combiner combines the signals of the respective channels in phase so that the enhanced sensitivity noted above is obtained.

Figure 6B:
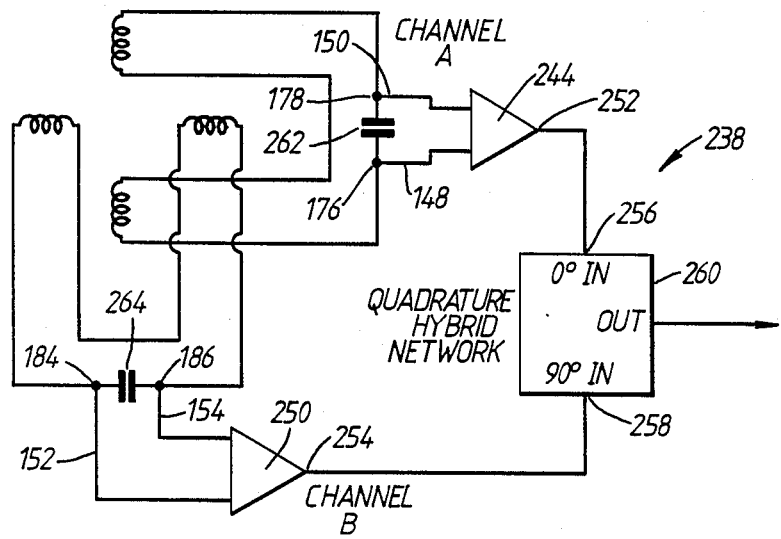

Quadrature receiver configuration 238 of FIG. 6B is analogous to quadrature transmitter configuration 192 shown in FIG. 5B, and differs from the first receiver configuration 220 shown in FIG. 6A in that the first and second channel signals are independently amplified prior to entering the phase shifter rather than after being combined. Transmit/receive terminals 176 and 178 of the first channel A of the antenna are coupled to the respective input terminals 240 and 242 of a first channel amplifier 244 by transmit/receive terminal leads 148 and 150. Transmit/receive terminals 184 and 186 of the second channel B of the antenna are coupled to the respective input terminals 246 and 248 of a second channel amplifier 250. The output terminals 252 and 254 of the first and second channel amplifiers are coupled to the input ports 256 and 258 of the first and second channels, respectively, of phase shifter 260. Phase shifter 260 comprises a quadrature combiner and first and second channels. Tuning capacitors 262 and 264 are placed between the first and second transmit/receive terminals of the respective channels of the antenna.

The circularly polarized rotating magnetic field described above is applied to the antenna by the precessing nuclei N, which results in a first channel signal on the first channel A of the antenna and a second channel signal shifted in phase by 90° with respect to the first channel signal on the second channel B of the antenna. Each of these signals is transmitted to the respective amplifiers 244 and 250 where they are amplified and transmitted to the respective input ports 256 and 258 of phase shifter 260. The phase of the second channel signal is shifted by 90° by phase shifter 260 so that it is in phase with the first channel signal. The first channel signal is then combined with the phase-shifted second channel signal by the quadrature combiner. The combined signal is the output of phase shifter 260. Thus, essentially the same result as for quadrature receiver configuration 220 is obtained.

Additional advantages and modifications will readily occur to those skilled in the art. For example, the coils of the quadrature antenna may be mounted with respect to one another as described herein without the use of a former. In this case, the longitudinal axis of the antenna is the axis which runs through the center point of the coils and is inclined approximately 45° with respect to each of the first through fourth planes. Equivalently, the longitudinal axis of the antenna is perpendicular to the plane formed by the minor axes of the first through fourth coils (i.e., reference plane 114). Thus, the longitudinal axis of the antenna is the axis which would have been longitudinal axis 106 of former 100 had a former been used.

As an additional example, the construction of the coils may vary from one coil to another, e.g., the number of windings, the size of the coil, and the dimensions and electrical conductivity of the conductor. Appropriate adjustments would be required to ensure that the magnetic fields produced by the coils were substantially orthogonal and of roughly equal or known and accomodated magnitude. Also, adjustments would be required for any phase variations introduced into the first or second channels.

The invention in its broader aspects is, therefore, not limited to the specific details, representative apparatus and illustrative examples shown and described. Accordingly, departures may be made from such details without departing from the spirit or scope of the general inventive concept as defined by the appended claims and their equivalents.

What is claimed is:

1. A quadrature antenna for magnetic resonance imaging having a longitudinal axis, said antenna comprising:
    a first channel including,
        a first elliptical coil lying in a first plane, the center point of said first coil coinciding with a reference point on said longitudinal axis, the minor axis of said first coil lying in a reference plane, said reference plane intersecting said longitudinal axis at said reference point and being normal to said longitudinal axis, said first plane being inclined approximately forty five degrees (45°) with respect to said longitudinal axis,
        a second elliptical coil lying in a second plane, the center point of said second coil coinciding with said reference point, the minor axis of said second coil lying in said reference plane and being colinear with the minor axis of said first coil, said second plane being normal to said first plane and inclined approximately forty five degrees (45°) with respect to said longitudinal axis, and
    means for electrically coupling said first channel to an external transmit/receive circuit; and a second channel including,
    a third elliptical coil lying in a third plane, the center point of said third coil coinciding with said reference point, the minor axis of said third coil lying in said reference plane and being perpendicular to said minor axis of said first coil, said third plane being inclined approximately forty five degrees (45°) with respect to said longitudinal axis,
    a fourth elliptical coil lying in a fourth plane, the center point of said fourth coil coinciding with said reference point, the minor axis of said fourth coil lying in said reference plane and being colinear with the minor axis of said third coil, said fourth plane being normal to said third plane and inclined approximately forty five degrees (45°) with respect to said longitudinal axis, and
    means for electrically coupling said second channel to an external transmit/receive circuit.

2. An antenna as recited in claim 1, wherein said first coil and said second coil are electrically coupled in series.

3. An antenna as recited in claim 1, wherein said first coil and said second coil are electrically coupled in parallel.

4. An antenna as recited in claim 1, wherein said third coil and said fourth coil are electrically coupled in series.

5. An antenna as recited in claim 1, wherein said third coil and said fourth coil are electrically coupled in parallel.

6. An antenna as recited in claim 1, further comprising means for shielding said first channel from said second channel.

7. An antenna as recited in claim 6, wherein said shielding means comprises means for electrostatically shielding said first channel from said second channel, said electrostatic shielding means including a first dielectric layer, a second dielectric layer, and a grounded conductive layer sandwiched between said first dielectric layer and said second dielectric layer.

8. An antenna as recited in claim 7, wherein at least one of said first and second dielectric layers comprises at least one of polyethylene, polypropylene, polystyrene, and a polyfluoro hydrocarbon.

9. An antenna as recited in claim 7, wherein at least one of said dielectric layers comprises polytetrafluoroethylene.

10. An antenna as recited in claim 1, further comprising a cylindrical former having a cylinder wall and a longitudinal axis, said first, second, third and fourth coils being wound to conform to said cylinder wall, and said longitudinal axis of said former being substantially colinear with said longitudinal axis of said antenna.

11. An antenna as recited in claim 1, further comprising an elliptic cylinder former having a cylinder wall and a longitudinal axis, said first, second, third and fourth coils being wound to conform to said cylinder wall, and said longitudinal axis of said former being substantially colinear with said longitudinal axis of said antenna.

12. A quadrature antenna for magnetic resonance imaging having a longitudinal axis, said antenna comprising:
    a first channel including,
        a first coil comprising at least one winding of an elongated conductor, a central one of said first coil windings lying substantially in a first plane and forming a first ellipse, the other of said first coil windings being adjacent and having substantially equal dimensions to said first coil central winding and being parallel to said first plane, the center point of said first ellipse coinciding with a reference point on said longitudinal axis, the minor axis of said first ellipse lying in a reference plane, said reference plane intersecting said longitudinal axis at said reference point and being normal to said longitudinal axis, said first plane being inclined approximately forty five degrees (45°) with respect to said longitudinal axis, a second coil comprising at least one winding of an elongated conductor, a central one of said second coil windings lying substantially in a second plane and forming a second ellipse, the other of said second coil windings being adjacent and having substantially equal dimensions to said second coil central winding and being parallel to said second plane, the center point of said second ellipse coinciding with said reference point, the minor axis of said second coil lying in said reference plane and being colinear with the minor axis of said first ellipse, said second plane being inclined approximately forty five degrees (45°) with respect to said longitudinal axis, and first channel coupling means for electrically coupling said first channel to an external transmit/receive circuit; and a second channel including, a third coil comprising at least one winding of an elongated conductor, a central one of said third coil windings lying substantially in a third plane and forming a third ellipse, the other of said third coil windings being adjacent and having substantially equal dimensions to said third coil central winding and being parallel to said third plane, the center point of said third ellipse coinciding with said reference point, the minor axis of said third ellipse lying in said reference plane and being perpendicular to the minor axis of said first ellipse, a fourth coil comprising at least one winding of an elongated conductor, a central one of said fourth coil windings lying substantially in a fourth plane and forming a fourth ellipse, the other of said fourth coil windings being adjacent and having substantially equal dimensions to said fourth coil central winding and being parallel to said fourth plane, the center point of said fourth ellipse coinciding with said reference point, the minor axis of said fourth ellipse lying in said reference plane and being colinear with the minor axis of said third ellipse, and second channel coupling means for electrically coupling said second channel to an external transmit/receive circuit.

13. An antenna as recited in claim 12, wherein said first coil and said second coil are electrically coupled in series.

14. An antenna as recited in claim 12, wherein said first coil and said second coil are electrically coupled in parallel.

15. An antenna as recited in claim 12, wherein said third coil and said fourth coil are electrically coupled in series.

16. An antenna as recited in claim 12, wherein said third coil and said fourth coil are electrically coupled in parallel.

17. An antenna as recited in claim 12, further comprising shielding means for shielding said first channel from said second channel.

18. An antenna as recited in claim 16, wherein said shielding means comprises means for electrostatically shielding said first channel from said second channel, said electrostatic shielding means including a first dielectric layer, a second dielectric layer, and a grounded conductive layer sandwiched between said first dielectric layer and said second dielectric layer.

19. An antenna as recited in claim 18, wherein at least one of said first and second dielectric layers comprises at least one of polyethylene, polypropylene, polystyrene, and a polyfluoro hydrocarbon.

20. An antenna as recited in claim 18, wherein at least one of said dielectric layers comprises polytetrafluoroethylene.

21. An antenna as recited in claim 12, further comprising a cylindrical former having a cylinder wall and a longitudinal axis, said first, second, third and fourth coils being wound to conform to said cylinder wall, and said longitudinal axis of said former being substantially colinear with said longitudinal axis of said antenna.

22. An antenna as recited in claim 12, further comprising an elliptic cylinder former having a cylinder wall and a longitudinal axis, said first, second, third and fourth coils being wound to conform to said cylinder wall, and said longitudinal axis of said former being substantially colinear with said longitudinal axis of said antenna.

* * * * *